United States Patent
Heiskanen et al.

(10) Patent No.: US 9,722,644 B2
(45) Date of Patent: Aug. 1, 2017

(54) FREQUENCY SWITCHING WITHIN TIME DOMAIN DIGITAL PRE-DISTORTION

(71) Applicant: NOKIA SOLUTIONS AND NETWORKS OY, Espoo (FI)

(72) Inventors: Antti Heiskanen, Oulu (FI); Eero Koukkari, Oulu (FI)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 14/829,296

(22) Filed: Aug. 18, 2015

(65) Prior Publication Data
US 2017/0054457 A1   Feb. 23, 2017

(51) Int. Cl.
| | | |
|---|---|---|
| H04B 1/04 | (2006.01) | |
| H03F 3/24 | (2006.01) | |
| H03F 3/19 | (2006.01) | |
| H03F 1/32 | (2006.01) | |

(52) U.S. Cl.
CPC ......... H04B 1/0475 (2013.01); H03F 1/3247 (2013.01); H03F 3/19 (2013.01); H03F 3/245 (2013.01); *H03F 2200/451* (2013.01); *H03F 2201/3224* (2013.01); *H04B 2001/0408* (2013.01)

(58) Field of Classification Search
CPC ........ H03F 1/3247; H03F 1/26; H04B 1/0475
See application file for complete search history.

(56) References Cited

U.S. PATENT DOCUMENTS

| 6,047,022 A | 4/2000 | Reuven |
| 6,587,514 B1* | 7/2003 | Wright .................. H03F 1/3241 |
| | | 330/149 |
| 6,658,045 B1 | 12/2003 | Jin |
| (Continued) | | |

FOREIGN PATENT DOCUMENTS

| EP | 2 254 240 A1 | 11/2010 |
| EP | 2 761 742 A1 | 8/2014 |
| (Continued) | | |

OTHER PUBLICATIONS

Freescale Semiconductor; "RF Power LDMOS Transistors"; N-Channel Enhancement-Mode Lateral MOSFETs; Document No. AFT23S160W02S; Technical Data; 15 pages.
(Continued)

*Primary Examiner* — Ross Varndell
(74) *Attorney, Agent, or Firm* — Squire Patton Boggs (US) LLP (57) ABSTRACT

Appropriate signal processing may be beneficial in a variety of communication systems and elements thereof. For example, time domain digital pre-distortion may benefit from suitable treatment of frequency switching. A method can include determining whether an instantaneous frequency of an input signal is positive or negative. The method can also include selecting a pre-distortion model from a set of pre-distortion models based on the determination of positive or negative instantaneous frequency. The method can further include applying the selected pre-distortion model to the input signal for a time corresponding to the determination of instantaneous frequency to provide an output signal. The method can additionally include providing the output signal to a power amplifier.

21 Claims, 4 Drawing Sheets

(56) References Cited

U.S. PATENT DOCUMENTS

| | | | |
|---|---|---|---|
| 6,885,709 B1 | 4/2005 | Dartois | |
| 8,380,144 B1 | 2/2013 | Bai et al. | |
| 2004/0122627 A1* | 6/2004 | Kybett | H03F 1/3247 |
| | | | 702/189 |
| 2004/0264596 A1 | 12/2004 | Vella-Coleiro | |
| 2005/0152487 A1 | 7/2005 | Reichard | |
| 2005/0212691 A1 | 9/2005 | Tirkel et al. | |
| 2006/0240786 A1* | 10/2006 | Liu | H03F 1/3247 |
| | | | 455/114.3 |
| 2007/0036238 A1* | 2/2007 | Matero | H03C 3/0925 |
| | | | 375/296 |
| 2008/0310573 A1* | 12/2008 | Lewis | H04L 27/12 |
| | | | 375/376 |
| 2013/0243121 A1 | 9/2013 | Bai | |

FOREIGN PATENT DOCUMENTS

| | | |
|---|---|---|
| WO | 02/17586 A1 | 2/2002 |
| WO | 2013/046183 A1 | 4/2013 |

OTHER PUBLICATIONS

Atso Hekkala; "Compensation of transmitter nonlinearities using predistortion techniques"; Case studies of envelope tracking amplifiers and radio-over-fibre links; VTT online report; 102 pages.

U.S. Office Action dated May 25, 2016 corresponding to related U.S. Appl. No. 14/829,315.

European Search Report issued in corresponding European Application No. 16176813.0 on Jan. 17, 2017.

U.S. Office Action dated Oct. 31, 2016 corresponding to U.S. Appl. No. 14/829,310.

* cited by examiner

FREQUENCY SWITCHING WITHIN TIME DOMAIN DIGITAL PRE-DISTORTION

BACKGROUND

Field

Appropriate signal processing may be beneficial in a variety of communication systems and elements thereof. For example, time domain digital pre-distortion may benefit from suitable treatment of frequency switching.

Description of the Related Art

Digital pre-distortion can be used within linearization of amplifiers, such as radio frequency (RF) power amplifiers. Typical conventional linearization algorithms manipulate the baseband signal at time-domain within linearization loop so that the RF power amplifier output is adaptively forced to be linear. Many time-domain algorithms can perform well for narrow band signals but performance drops quickly when the signal bandwidth is increased.

The reason for such drop in performance may be the nature of the RF power amplifier (PA) distortion. PA distortion can be linearized through circuit level design and through transistor technology development/selection. Digital pre-distortion (DPD) can be considered a system level linearizer that can further improve the RF PA linearity.

From a digital pre-distortion point of view the distortion can be viewed as nonlinear variation of complex gain. An example of a DPD therefore can be a non-linear gain pre-distorter. A linear baseband signal can be multiplied with a non-linear gain element at the digital time domain. Hence, the original baseband signal can be distorted. The result can be referred to as a pre-distortion signal. An adaptive algorithm can adjust the nonlinear gain element so that when the pre-distortion signal goes through an RF power amplifier the PA output may be linear.

When the base band signal bandwidth is increased, the RF power amplifier distortion mechanisms can change. Thus, conventional DPD linearization performance can drop. The performance may drop because the distortion starts to have frequency dependent magnitude changes. These changes may not be seen when the signal bandwidth is narrow. The frequency dependent distortion magnitude change can be referred to as a memory effect. Memory effects that are asymmetric are conventionally difficult to linearize.

Two-tone power and tone-spacing sweeps can be used to get first hand predictions of the PA memory effects. The amplifier can be excited with a two-tone signal and the tone spacing can be varied while the input signal power is kept constant. Because the input signal power is constant, the distortion should not change while the tone-spacing changes. However, intermodulation (IM) distortion (IMD) levels may change because the distortion mechanisms change as function of signal bandwidth, in addition to other contributions. Thus, the lower and upper IMD components may change differently as function of signal bandwidth, two-tone spacing.

Thus, the distortion, or non-linear variation of the gain, can have memory and asymmetry. The two-tone test may give an indication of RF power amplifier broadband linearity capabilities and may give first-hand information for DPD point of view.

On the other hand, a memoryless non-linear gain pre-distorter may be unable to produce a pre-distortion signal that changes as function of bandwidth. Some non-linear gain algorithms may contain filters for different order distortion voltages so that there is wider set of distortion contributors that can be adaptively controlled. Still, the asymmetry may be difficult to linearize conventionally.

Figure 1:
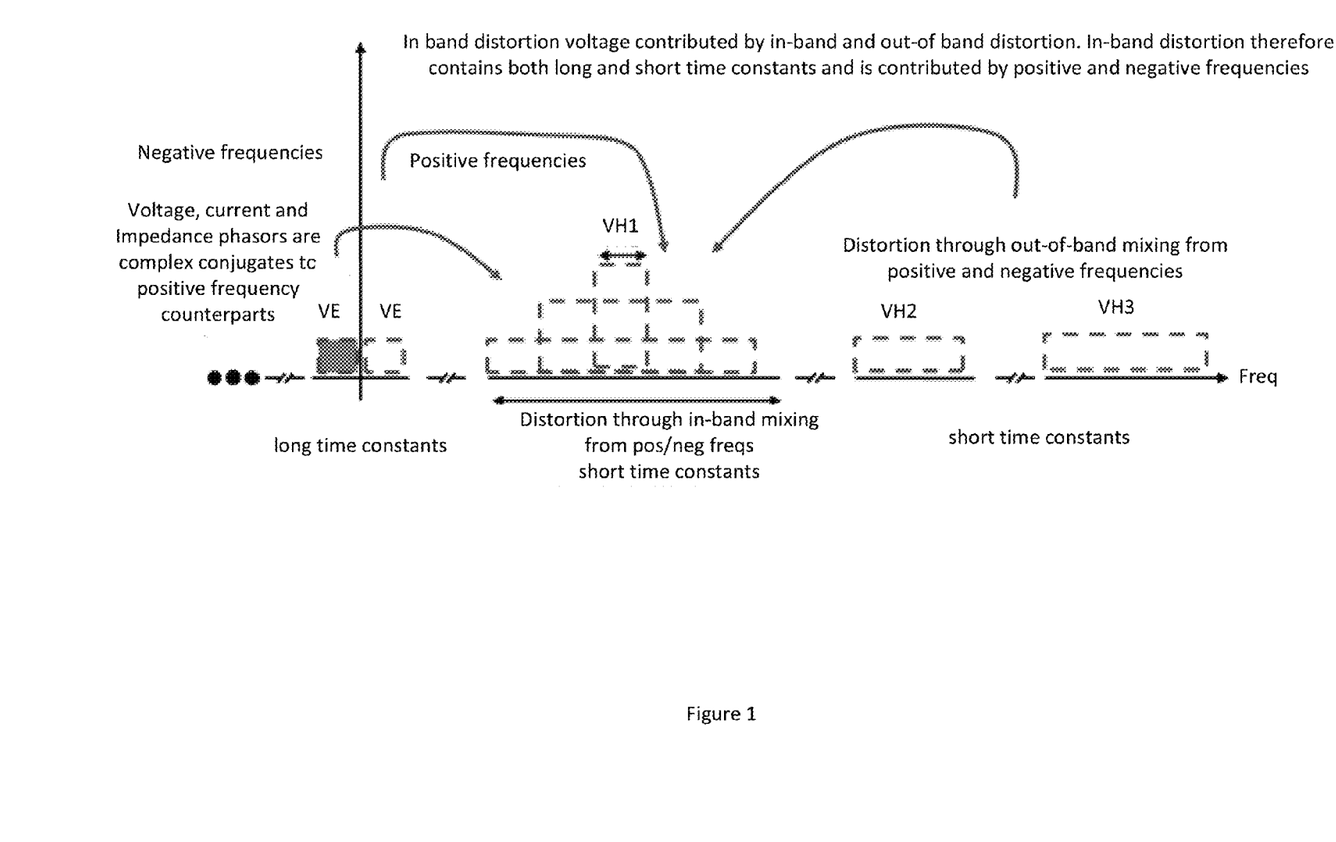
FIG. 1 illustrates generation of distortion within an RF power amplifier.

FIG. 1 illustrates generation of distortion within an RF power amplifier. As shown in FIG. 1, there can be long and short time constants within distortion and distortion may be asymmetric against a center frequency. The two-tone test does not completely predict RF PA linearity performance. For example, distortion may be different in the case of a modulated signal.

FIG. 1 visualizes the distortion generation within RF amplifier in general. The RF power amplifier resistive and capacitive nonlinearities can create nth-order distortion currents. These distortion currents can transform into circuit nodal voltages through the impedances or trans-impedances seen by the individual distortion current contributor. The non-linear currents can be controlled by broadband voltage spectrum. In-band distortion can also be contributed by the out-of band nodal voltages through up-conversion and down-conversion process of the non-linear elements, which can also be referred to as self-mixing.

Hence, the RF power amplifier linear gain may be varied. The gain variation can be non-linear and the nonlinearity can contain short and long time constant filtering mechanisms of the circuit. Bias circuits and thermal constants can introduce long-time constant memory effects. On the other hand, in-band and higher frequency nodal impedances can introduce short time constant memory effects. These effects may add complexity to the RF power amplifier base band modelling, for example, to the pre-distortion modelling.

SUMMARY

According to certain embodiments, a method can include determining whether an instantaneous frequency of an input signal is positive or negative. The method can also include selecting a pre-distortion model from a set of pre-distortion models based on the determination of positive or negative instantaneous frequency. The method can further include applying the selected pre-distortion model to the input signal for a time corresponding to the determination of instantaneous frequency to provide an output signal. The method can additionally include providing the output signal to a power amplifier.

In certain embodiments, an apparatus can include at least one processor and at least one memory including computer program code. The at least one memory and the computer program code can be configured to, with the at least one processor, cause the apparatus at least to determine whether an instantaneous frequency of an input signal is positive or negative. The at least one memory and the computer program code can also be configured to, with the at least one processor, cause the apparatus at least to select a pre-distortion model from a set of pre-distortion models based on the determination of positive or negative instantaneous frequency. The at least one memory and the computer program code can further be configured to, with the at least one processor, cause the apparatus at least to apply the selected pre-distortion model to the input signal for a time corresponding to the determination of instantaneous frequency to provide an output signal. The at least one memory and the computer program code can additionally be configured to, with the at least one processor, cause the apparatus at least to provide the output signal to a power amplifier.

According to certain embodiments, an apparatus can include means for determining whether an instantaneous frequency of an input signal is positive or negative. The apparatus can also include means for selecting a pre-distortion model from a set of pre-distortion models based on the determination of positive or negative instantaneous frequency. The apparatus can further include means for applying the selected pre-distortion model to the input signal for a time corresponding to the determination of instantaneous frequency to provide an output signal. The apparatus can additionally include means for providing the output signal to a power amplifier.

In certain embodiments, a computer program product can include instructions for performing a process. The process can include determining whether an instantaneous frequency of an input signal is positive or negative. The process can also include selecting a pre-distortion model from a set of pre-distortion models based on the determination of positive or negative instantaneous frequency. The process can further include applying the selected pre-distortion model to the input signal for a time corresponding to the determination of instantaneous frequency to provide an output signal. The process can additionally include providing the output signal to a power amplifier.

A non-transitory computer-readable medium can, according to certain embodiments, be encoded with instructions that, when executed in hardware, perform a process. The process can include determining whether an instantaneous frequency of an input signal is positive or negative. The process can also include selecting a pre-distortion model from a set of pre-distortion models based on the determination of positive or negative instantaneous frequency. The process can further include applying the selected pre-distortion model to the input signal for a time corresponding to the determination of instantaneous frequency to provide an output signal. The process can additionally include providing the output signal to a power amplifier.

BRIEF DESCRIPTION OF THE DRAWINGS

For proper understanding of the invention, reference should be made to the accompanying drawings, wherein.

DETAILED DESCRIPTION

Certain embodiments can be used in connection within time-domain digital pre-distortion (DPD) linearization. For example, certain embodiments relate to enhancing the performance of time-domain DPD for broadband signals. Certain embodiments can take the baseband signal instantaneous frequency polarity as an additive parameter to adjust the DPD output. Thus, in certain embodiments, linearization may be applied successfully to broadband signals.

Certain embodiments may separate negative and positive frequencies through the use of instantaneous frequency polarity as one parameter. Therefore, the model according to certain embodiments may be much computationally simpler than many other DPD models while still effectively controlling distortion frequency dependencies.

In certain embodiments, a positive/negative frequency switch can be used within time-domain DPD. The frequency switch can separate the pre-distortion function into two individual functions. Thus, the DPD can be performed separately for positive and negative frequencies. The distortion of a PA with memory effects may be different for positive and negative frequencies, as mentioned above. As mentioned above, IMD asymmetry can be one indication of such asymmetry.

Figure 2:
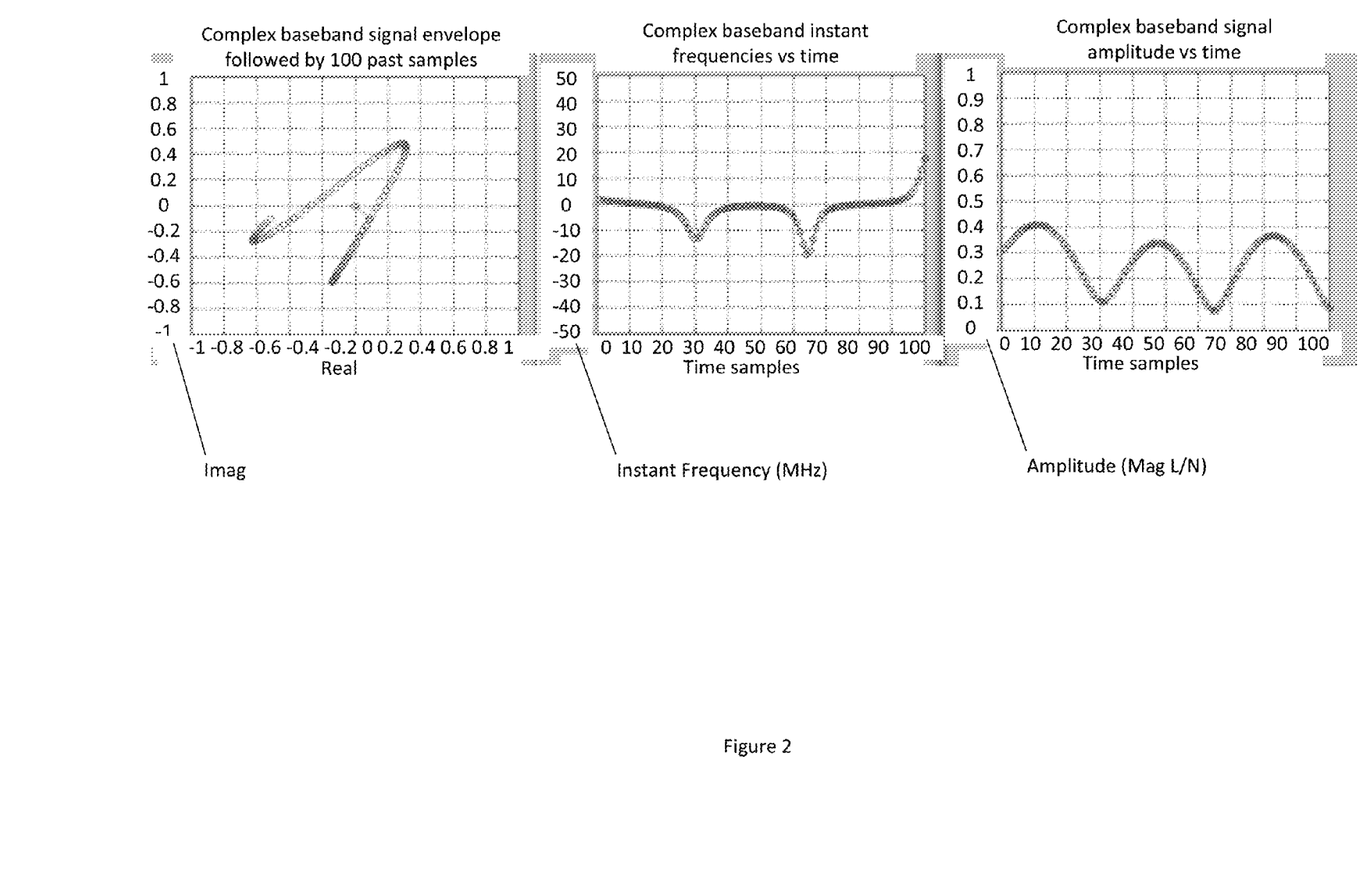
FIG. 2 illustrates complex baseband signal phasor and corresponding instant frequency and signal magnitude over 100 consecutive samples.

FIG. 2 illustrates complex baseband signal phasor and corresponding instant frequency and signal magnitude over 100 consecutive samples. In this example, the behavior of instant frequency is shown by using a 10 MHz two-carrier orthogonal frequency division multiplexed (OFDM) signal.

In FIG. 2, the complex phasor is one presentation form for the baseband signal, with the peak amplitude scaled to be 0.6. The vector that ends at one circle represents a current complex baseband signal sample while the other ninety-nine circles show the previous baseband signal sample values. The magnitude and phase of the complex phasor is the signal that would modulate the RF carrier, including amplitude and phase. There can be only one amplitude and frequency at a time.

The instantaneous frequency can be considered positive when the baseband signal complex phasor rotates counter-clockwise and negative when the phasor rotates clockwise. The highest instant frequency is achieved when the signal is closest to the IQ-plane origin. This may be because near the origin small amplitude changes can make the largest phase deviation while the small amplitude changes for large envelope phasor cannot change the phase as much, and thus the instant frequency may not change so rapidly.

As can be seen from FIG. 2, for the studied time period the instant frequency changes from positive to negative and then from negative to positive. The highest amplitude levels may represent close to peak power drive to the PA, with 0.6 being peak amplitude. The amplitude changes are sharp but the instant frequency changes smoothly due high complex phasor amplitude. These high peak power time periods can create distortion that may have long time constant and/or asymmetry. Thus, even with asymmetry one can pre-distort if the pre-distortion is done with different pre-distortion models respectively for positive and negative frequencies.

The reason why simple frequency switching may be enough is that the instant frequency changes may be very small, soft and smooth for large baseband signal amplitudes compared to instant frequency for small signal amplitudes. At the same time, most of the distortion may be generated by the PA under medium and high input signal power. Due to the smooth instant frequency behavior during high power envelope times, simple frequency switching may be sufficient. The medium and high input signal power can be respectively the power levels when the PA is driven into medium output back off level from its compression point and when the PA is driven slightly below or above its compression point correspondingly. These levels may vary, but generally PA creates highest distortion signals when the PA is driven with such mentioned power levels. For example, the output back off level that sets the limit between medium or high input power level may vary. Usually the so called small-signal level is the level when the PA is considered to be linear enough. The frequency switching is not limited to medium or high power levels, instead it can be used for all signal power levels.

During the high signal power time periods, the RF PA transistor heat and bias circuits may be modulated. The memory effect contributed by the envelope frequencies can create distortion with long time constants. The envelope frequency contributions within in-band distortion may be one cause of IMD asymmetry and linearization difficulties.

With a frequency switching technique, the DPD can contain two long time constant nonlinear envelope filters, one for negative frequencies and one for positive frequencies. This way, the pre-distortion signal can have long-time-constant envelope memory effect compensation that also automatically takes account of asymmetric pre-distortion. This benefit may arise because an individual nonlinear filter can be used for positive and negative frequencies.

The frequency switching can also be used for short-time constant distortion correction. Indeed, the same frequency switching can be used in such cases. When the RF PA is modulated with an envelope signal, the RF signal may have only one amplitude and frequency at a time.

Figure 3:
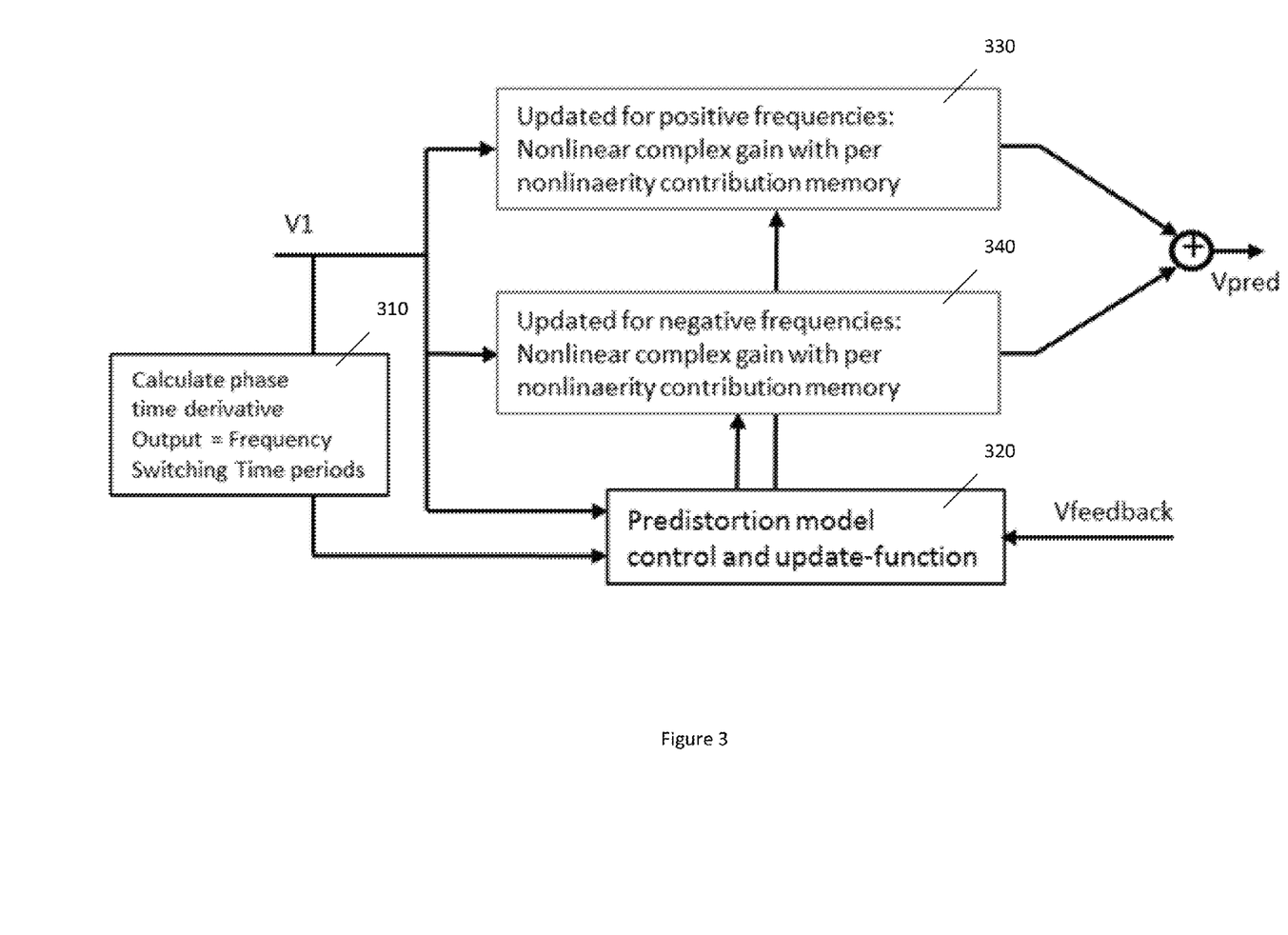
FIG. 3 illustrates a pre-distortion model with positive and negative frequency switching, according to certain embodiments.

FIG. 3 illustrates a pre-distortion model with positive and negative frequency switching, according to certain embodiments. In addition to conventional time-domain processing, for example to polynomial memory polynomial pre-distortion, there can be two pre-distortion models that are updated and used one at a time. Also, the instantaneous frequency can be calculated for the feedback signal, and used within the pre-distortion model update.

In certain embodiments, the pre-distortion model may be any time domain algorithm. An additive parameter to such a model can be frequency switching. Hence, the corresponding pre-distortion model can be updated with frequency switching selected data, considering time-domain waveforms that contain only positive or negative frequencies.

As shown in FIG. 3, an input signal V1 can be provided. The input signal V1 can be received at a polarity detection unit 310 configured to calculate phase time derivative. The output of polarity detection unit 310 can be the frequency switching time periods.

The input signal V1 can also be provided to a control unit 320 configured to provide pre-distortion model control and updating. This control unit 320 can determine which of positive model 330 or negative model 340 should be selected for use and for updating. The control unit 320 can also receive a feedback signal, Vfeedback.

Each of positive model 330 and negative model 340 can receive the input signal V1. The models 330 and 340 can provide their outputs, which can, in combination, be used as a pre-distorted output value, Vpred, for the pre-distortion model.

Figure 4:
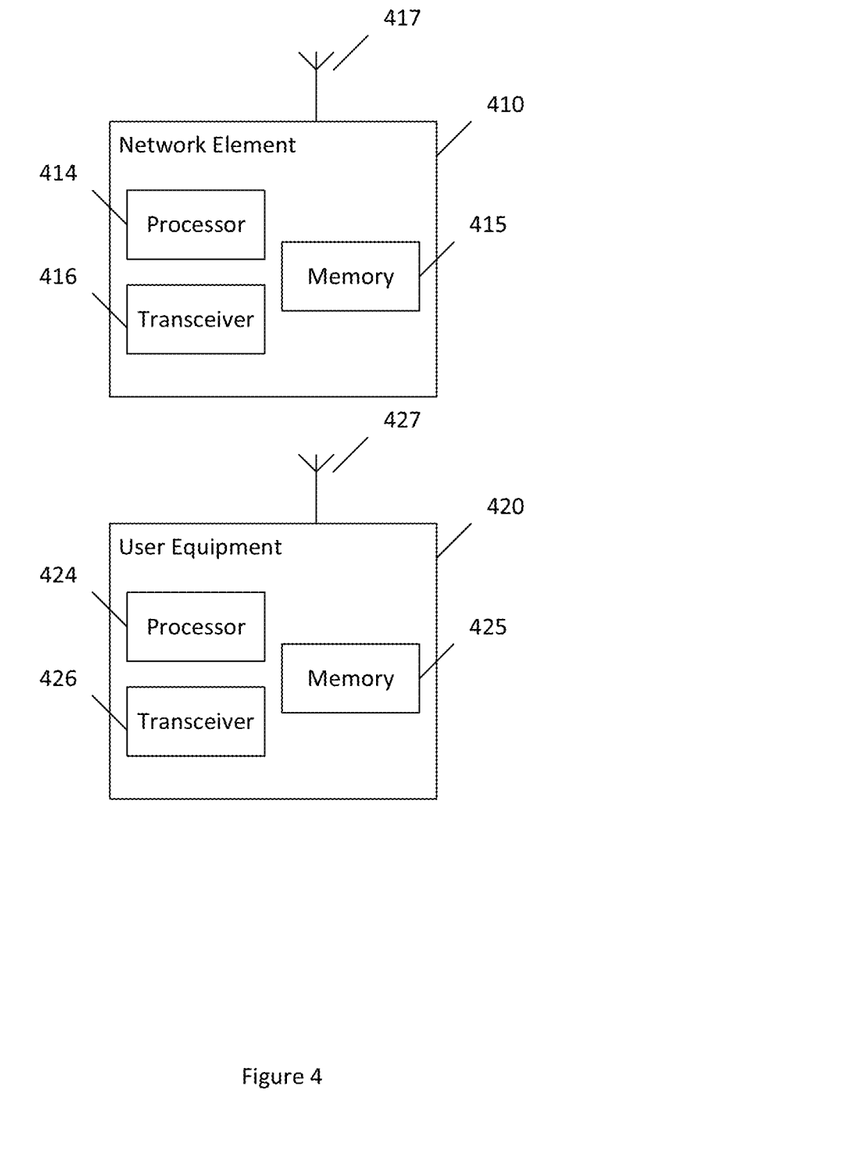
FIG. 4 illustrates a system according to certain embodiments.

FIG. 4 illustrates a system according to certain embodiments of the invention. It should be understood that each block of the flowchart of FIG. 3 may be implemented by various means or their combinations, such as hardware, software, firmware, one or more processors and/or circuitry. In one embodiment, a system may include several devices, such as, for example, network element 410 and user equipment (UE) or user device 420. The system may include more than one UE 420 and more than one network element 410, although only one of each is shown for the purposes of illustration. A network element can be an access point, a base station, an eNode B (eNB), or any other network element. Each of these devices may include at least one processor or control unit or module, respectively indicated as 414 and 424. At least one memory may be provided in each device, and indicated as 415 and 425, respectively. The memory may include computer program instructions or computer code contained therein, for example for carrying out the embodiments described above. One or more transceiver 416 and 426 may be provided, and each device may also include an antenna, respectively illustrated as 417 and 427. Although only one antenna each is shown, many antennas and multiple antenna elements may be provided to each of the devices. Other configurations of these devices, for example, may be provided. For example, network element 410 and UE 420 may be additionally configured for wired communication, in addition to wireless communication, and in such a case antennas 417 and 427 may illustrate any form of communication hardware, without being limited to merely an antenna.

Transceivers 416 and 426 may each, independently, be a transmitter, a receiver, or both a transmitter and a receiver, or a unit or device that may be configured both for transmission and reception. The transmitter and/or receiver (as far as radio parts are concerned) may also be implemented as a remote radio head which is not located in the device itself, but in a mast, for example. It should also be appreciated that according to the "liquid" or flexible radio concept, the operations and functionalities may be performed in different entities, such as nodes, hosts or servers, in a flexible manner. In other words, division of labor may vary case by case. One possible use is to make a network element to deliver local content. One or more functionalities may also be implemented as a virtual application that is provided as software that can run on a server.

A user device or user equipment 420 may be a mobile station (MS) such as a mobile phone or smart phone or multimedia device, a computer, such as a tablet, provided with wireless communication capabilities, personal data or digital assistant (PDA) provided with wireless communication capabilities, portable media player, digital camera, pocket video camera, navigation unit provided with wireless communication capabilities or any combinations thereof. The user device or user equipment 420 may be a sensor or smart meter, or other device that may usually be configured for a single location.

In an exemplifying embodiment, an apparatus, such as a node or user device, may include means for carrying out embodiments described above in relation to FIG. 3.

Processors 414 and 424 may be embodied by any computational or data processing device, such as a central processing unit (CPU), digital signal processor (DSP), application specific integrated circuit (ASIC), programmable logic devices (PLDs), field programmable gate arrays (FPGAs), digitally enhanced circuits, or comparable device or a combination thereof. The processors may be implemented as a single controller, or a plurality of controllers or processors. Additionally, the processors may be implemented as a pool of processors in a local configuration, in a cloud configuration, or in a combination thereof.

For firmware or software, the implementation may include modules or unit of at least one chip set (e.g., procedures, functions, and so on). Memories 415 and 425 may independently be any suitable storage device, such as a non-transitory computer-readable medium. A hard disk drive (HDD), random access memory (RAM), flash memory, or other suitable memory may be used. The memories may be combined on a single integrated circuit as the processor, or may be separate therefrom. Furthermore, the computer program instructions may be stored in the memory and which may be processed by the processors can be any suitable form of computer program code, for example, a compiled or interpreted computer program written in any suitable programming language. The memory or data storage entity is typically internal but may also be external or a combination thereof, such as in the case when additional memory capacity is obtained from a service provider. The memory may be fixed or removable.

The memory and the computer program instructions may be configured, with the processor for the particular device, to cause a hardware apparatus such as network element 410 and/or UE 420, to perform any of the processes described above (see, for example, FIG. 3). Therefore, in certain embodiments, a non-transitory computer-readable medium may be encoded with computer instructions or one or more computer program (such as added or updated software routine, applet or macro) that, when executed in hardware, may perform a process such as one of the processes described herein. Computer programs may be coded by a programming language, which may be a high-level programming language, such as objective-C, C, C++, C#, Java, etc., or a low-level programming language, such as a machine language, or assembler. Alternatively, certain embodiments of the invention may be performed entirely in hardware.

Furthermore, although FIG. 4 illustrates a system including a network element 410 and a UE 420, embodiments of the invention may be applicable to other configurations, and configurations involving additional elements, as illustrated and discussed herein. For example, multiple user equipment devices and multiple network elements may be present, or other nodes providing similar functionality, such as nodes that combine the functionality of a user equipment and an access point, such as a relay node.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

List of Abbreviations

DPD Digital pre-distortion
IMD Inter Modulation Distortion (cross distortion product created by two or more different frequency signals)
DSP Digital Signal Processing

We claim:

1. A method, comprising:
   determining whether an instantaneous frequency of an input signal is positive or negative;
   selecting a pre-distortion model from a set of pre-distortion models based on the determination of positive or negative instantaneous frequency;
   applying the selected pre-distortion model to the input signal for a time corresponding to the determination of instantaneous frequency to provide an output signal; and
   providing the output signal to a power amplifier, wherein the output signal is obtained through separately pre-distorting positive and negative signal frequency components of the input signal.

2. The method of claim 1, wherein the input signal comprises a broadband communication signal.

3. The method of claim 1, further comprising:
   updating the selected pre-distortion model based on feedback from a same polarity of instantaneous frequency.

4. The method of claim 3, therein the updating comprises updating a memory storing nonlinear complex gain with per nonlinearity contribution.

5. The method of claim 1, further comprising:
   using a first individual nonlinear filter for positive frequencies and a second individual nonlinear filter for negative frequencies.

6. The method of claim 1, wherein the selecting the pre-distortion model is further contingent on a desired output signal to the power amplifier being a small, medium or high power signal.

7. The method of claim 1, wherein the input signal comprises a radio frequency power amplifier signal modulated with an envelope signal.

8. An apparatus, comprising:
   at least one processor; and
   at least one memory including computer program code,
   wherein the at least one memory and the computer program code are configured to, with the at least one processor, cause the apparatus at least to
   determine whether an instantaneous frequency of an input signal is positive or negative;
   select a pre-distortion model from a set of pre-distortion models based on the determination of positive or negative instantaneous frequency;
   apply the selected pre-distortion model to the input signal for a time corresponding to the determination of instantaneous frequency to provide an output signal; and
   provide the output signal to a power amplifier, wherein the output signal is obtained through separately pre-distorting positive and negative signal frequency components of the input signal.

9. The apparatus of claim 8, wherein the input signal comprises a broadband communication signal.

10. The apparatus of claim 8, wherein the at least one memory and the computer program code are configured to, with the at least one processor, cause the apparatus at least to update the selected pre-distortion model based on feedback from a same polarity of instantaneous frequency.

11. The apparatus of claim 10, wherein the at least one memory and the computer program code are configured to, with the at least one processor, cause the apparatus at least to update a memory configured to store nonlinear complex gain with per nonlinearity contribution.

12. The apparatus of claim 8, wherein the at least one memory and the computer program code are configured to, with the at least one processor, cause the apparatus at least to use a first individual nonlinear filter for positive frequencies and a second individual nonlinear filter for negative frequencies.

13. The apparatus of claim 8, wherein the at least one memory and the computer program code are configured to, with the at least one processor, cause the apparatus at least to select the pre-distortion model further contingent on a desired output signal to the power amplifier being a small, medium or high power signal.

14. The apparatus of claim 8, wherein the input signal comprises a radio frequency power amplifier signal modulated with an envelope signal.

15. An apparatus, comprising:
   means for determining whether an instantaneous frequency of an input signal is positive or negative;
   means for selecting a pre-distortion model from a set of pre-distortion models based on the determination of positive or negative instantaneous frequency;

means for applying the selected pre-distortion model to the input signal for a time corresponding to the determination of instantaneous frequency to provide an output signal; and means for providing the output signal to a power amplifier, wherein the output signal is obtained through separately pre-distorting positive and negative signal frequency components of the input signal.

16. The apparatus of claim 15, wherein the input signal comprises a broadband communication signal.

17. The apparatus of claim 15, further comprising:
means for updating the selected pre-distortion model based on feedback from a same polarity of instantaneous frequency.

18. The apparatus of claim 17, therein the updating comprises updating a memory storing nonlinear complex gain with per nonlinearity contribution.

19. The apparatus of claim 15, further comprising:
means for using a first individual nonlinear filter for positive frequencies and a second individual nonlinear filter for negative frequencies.

20. The apparatus of claim 15, wherein the selecting the pre-distortion model is further contingent on a desired output signal to the power amplifier being a medium or high power signal.

21. The apparatus of claim 15, wherein the input signal comprises a radio frequency power amplifier signal modulated with an envelope signal.

* * * * *